(12) United States Patent
Liebig et al.

(10) Patent No.: US 11,656,311 B2
(45) Date of Patent: May 23, 2023

(54) METHOD AND DEVICE FOR CONTROLLING A MAGNETIC RESONANCE IMAGING SYSTEM

(71) Applicant: Siemens Healthcare GmbH, Erlangen (DE)

(72) Inventors: Patrick Liebig, Erlangen (DE); Rene Gumbrecht, Herzogenaurach (DE); Jürgen Herrler, Erlangen (DE); Armin Nagel, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/238,659

(22) Filed: Apr. 23, 2021

(65) Prior Publication Data

US 2021/0333345 A1    Oct. 28, 2021

(30) Foreign Application Priority Data

Apr. 24, 2020  (EP) .................................... 20171345

(51) Int. Cl.
  *G01R 33/54*  (2006.01)
  *G01R 33/48*  (2006.01)
  *G01R 33/56*  (2006.01)
(52) U.S. Cl.
  CPC ....... *G01R 33/543* (2013.01); *G01R 33/4818* (2013.01); *G01R 33/5608* (2013.01)
(58) Field of Classification Search
  CPC .............. G01R 33/4818; G01R 33/543; G01R 33/5608
  See application file for complete search history.

(56) References Cited

U.S. PATENT DOCUMENTS

| | | | |
|---|---|---|---|
| 2010/0066361 A1* | 3/2010 | Setsompop | G01R 33/3415 324/309 |
| 2014/0210471 A1* | 7/2014 | Stemmer | G01R 33/4835 324/309 |
| 2020/0011953 A1 | 1/2020 | Tomi-tricot et al. | |
| 2020/0142057 A1* | 5/2020 | Pendse | G01R 33/5608 |

FOREIGN PATENT DOCUMENTS

EP          3594710 A1    1/2020

OTHER PUBLICATIONS

European Search Report for European Application No. 20171345. 0-1010 dated Oct. 27, 2020.

(Continued)

*Primary Examiner* — Gregory H Curran
(74) *Attorney, Agent, or Firm* — Lempia Summerfield Katz LLC (57) ABSTRACT

A pulse-design unit for creating pulse data for controlling a magnetic resonance system includes a data interface configured for receiving an examination scheme, and a calculation module configured for generating pulse data based on an examination scheme. The pulse-design unit includes a data grid and/or parameter values created from map pairs of a plurality of patients and is configured to select and/or calculate pulse data using the data grid and/or parameter values and a provided examination scheme. A method and a control device for controlling a magnetic resonance imaging (MRI) system and a related magnetic resonance imaging system are also provided.

23 Claims, 3 Drawing Sheets

(56) References Cited

OTHER PUBLICATIONS

Herrler, Jürgen et al: "Fully embedded parallel transmission: Stable performances using universal pulses with fast online customization"; International Society for Magnetic Resonance in Medicine; vol. 28; Jul. 24, 2020; pp. 1-3; XP055740768; URL: http://indexsmart.mirasmart.com/ISMRM2020/PDFfiles/3694.html.

Mirfin, C., P. Glover, and R. Bowtell. "Optimisation of parallel transmission radiofrequency pulses using neural networks." Proc. 26th Annu. Meeting ISMRM. 2018. pp. 1-3.

Tomi-Tricot, Raphaël, et al. "SmartPulse, a machine learning approach for calibration-free dynamic RF shimming: Preliminary study in a clinical environment." Magnetic resonance in medicine 82.6 (2019): 2016-2031.

\* cited by examiner

METHOD AND DEVICE FOR CONTROLLING A MAGNETIC RESONANCE IMAGING SYSTEM

This application claims the benefit of European Patent Application No. EP 20171345.0, filed on Apr. 24, 2020, which is hereby incorporated by reference in its entirety.

BACKGROUND

The present embodiments relate to a method and a device for controlling a magnetic resonance imaging system.

Magnet resonance imaging is performed at various values for the strength of the basic magnetic field. Besides "low" or "normal" or "high" fields (e.g., up to 3 T), magnet resonance imaging may also be performed with basic fields of higher than 3 T (e.g., Very High Fields (VHF)) or 7 T (Ultra High Fields (UHF)).

In UHF imaging (e.g., but also beginning in VHF), a method referred to as "parallel transmit channel" (pTx) is used to counteract B1 inhomogeneities due to the shorter wavelength. A way to design pTx pulses is referred to as Universal Pulses (UP). Universal Pulses are designed upon a set of B0 and B1 maps from different volunteers. The advantage is that these pulses may now be applied without the necessity to re-acquire the B0 and B1 maps, which takes time during the actual acquisition. Alternatively, UP may be used as a starting value for the optimization to first speed up the optimization itself and secondly making it more robust via the avoidance of local minima in the optimization. This approach has shown promising result for non-selective pulse types that excite the whole volume at once.

In magnetic resonance imaging (MRI), however, slab/slice-selective or reduced FOV pulses (in the following, referred to as "Selective Pulses") are used. These have in common that not the whole volume is excited but only a subset is excited, from which a MR signal may be generated. These pulses change dependent on position. For example, a sagittal slice needs an entirely different pulse compared to a transversal slice.

Up to now, the decision as to which pulse to use for which selective pulse was performed manually and not at all integrated.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the known systems, devices, and methods are improved to facilitate an improvement in controlling a magnetic resonance imaging system.

The aim of the present embodiments is an automated solution to find the optimal pulses (e.g., selective pulses) to form a pulse sequence. To reach this aim, a special unit (e.g., "pulse-design unit") that is able to provide pulses and/or optimize pulses that may be used to form the pulse sequence is introduced. These pulses may be pTx pulses. Since it is not necessary that the pulse-design unit applies the pulses directly (e.g., this may be done by the regular units of an MRI), it is not necessary that the pulse design unit provides the actual pulses, but information about the shape, duration, application channel, and timing of pulses. Thus, the pulse-design unit provides "pulse data" that is data that includes all necessary information for a pulse generator (e.g., a sequence control unit, a radio frequency transmission device, or a gradient system interface) to generate the correct pulses.

Starting from a set of B0 and B1 maps (e.g., "map pairs") from various patients, the pulses are configured by interpolating the pulses on a grid and/or by a neural network. On the grid, pulses (e.g., selective pulses) may be generated for each orientation, thereby forming a dictionary of selective pulses. However, the pulses do not necessarily have to be configured to excite and record slices or slabs (e.g., selective pulses), but also voluminous regions like cubes or spheres (e.g., non-selective pulses). The kind of the desired measurement (e.g., body region, shape of the examination area, such as slices or cube) is given by a predefined examination scheme that is provided to the pulse-design unit. The optimal pulses for a measurement according to that examination scheme are then calculated by the present embodiments. The examination scheme typically includes information about the contrasts to be measured and the order and shape of sub-regions of a region of interest to be recorded.

For example, during an actual scan, depending on the orientation of the measurement (e.g., the orientation of a slice) given by an examination scheme, the optimal pulse data may be extracted from the dictionary or calculated by the neural network. Instead of using a fixed grid, a relative grid to the brain mask may also be employed (e.g., also designated as "dictionary" or realized by a neural network). Typically, the dictionary is advantageous for selective pulses, and the neural network may also be applied for both nonselective pulses and pulses selecting any kind of sub-region (e.g., arbitrary sub-region).

A pulse-design unit according to the present embodiments is suitable for creating pulse data for controlling a magnetic resonance system (e.g., data including sufficient information to create pulses for an MRI pulse sequence, such as information about pulse-shapes, duration, application channel and timing of pulses (relative or absolute)). These pulses may be selective pulses or non-selective pulses. The pulse-design unit may be a physical unit or a software module in a computing unit (e.g., inside a control unit of an MRI system) and includes the following components.

The pulse-design unit includes a data interface configured for receiving an examination scheme, and, for example, also a map pair (e.g., B0 map and B1 map), and a calculation module configured for generating pulse data based on an examination scheme, and, for example, also on a map pair.

The pulse-design unit (e.g., the computing unit of the pulse-design unit) includes a data grid and/or parameter values created from map pairs of a plurality of patients and is configured to select and/or calculate pulse data using the data grid and/or parameter values and a provided examination scheme.

A suitable data interface is well known in the art and is used to input external data into the calculation module. The data interface may be configured as a data bus or as an actual interface (e.g., USB).

The general design of a suitable calculation module is also well known. For example, a calculation module includes a memory, a processor (or controller), and a random access memory. However, the exact setup of the calculation unit (e.g., algorithm or hardware setup) is special.

The pulse-design unit (e.g., the computing unit of the pulse-design unit) is configured to generate pulse data by using the data grid or parameter values. These components are created from map pairs (e.g., reference map pairs) of a plurality of different patients. Thus, an actual measurement does not necessarily need information about the actual patient, but may derive the optimal pulse data from "knowledge" about the map pairs (e.g., reference map pairs). The generation of the pulse data may be accomplished by selecting pulse data from a predefined group of pulse data (e.g., from the grid being a dictionary) and/or by calculating pulse data using means specially configured by using the map pairs (e.g. reference map pairs; with a neural network working with the parameter values).

The pulse data may be selective pulse data (e.g., for recording slabs or slices) or non-selective pulse data (e.g., for recording areas expanded in all three spatial axes like cubes or spheres). The pulse data may include data to generate pTx pulses (e.g., complete pTx pulses with trajectories and RF shapes). Alternatively or additionally, the pulse data includes parameters (e.g., combined optimization values (COV)) to generate/optimize pTx pulses from predefined pulses or B0/B1 maps of a patient previously measured. In one embodiment, the COV defines a trajectory and/or regulate or optimize pulse shapes based on prior recorded B1/B0 maps. Thus, in most applications, the pulse data provided by the pulse-design unit are complete pulses (e.g., pTx pulses) that may be arranged to form a pulse sequence or information to optimize predefined pulses (e.g., COV). For example, there exists a generic pulse sequence that is optimized by altering the pulses of the pulse sequence by using the COV that are generated by the pulse-design unit. In one embodiment, the pulse design unit is also configured to alter predefined pulses and/or to create a pulse sequence by using the generated pulse data.

A data grid may be present in form of a dictionary. The term "dictionary" provides that values are sorted in an order that makes the values detectable by knowing an examination scheme. This may be realized by a grid or a database structure.

Regarding provided data, Virtual Observation Points (VOP) data may also be provided together with the map pairs. The VOP data includes specific absorption rate (SAR) data (e.g., compressed) configured to calculate SAR distribution. The SAR distribution describes where in a body region (e.g., the brain) local heating is expected, since in UHF, an inhomogeneous distribution of hotspots due to SAR is generated.

A suitable method to generate pTx pulses from given trajectories, including gradient trajectories and RF pulse shapes (e.g., voltage curves), for a number of coil channels (e.g., every coil channel), is well known in the art. For example, combined optimization values that define the respective trajectory and regulate an RF pulse optimization are calculated.

The Combined Optimization Values (COV) are calculated offline with an optimization of the trajectory parameters ($P_t$) together with a weighting of the energy regularization ($\lambda_0$) during pulse-shape optimization: COV:=[$P_t$, $\lambda_0$]. This is done based on a normalized root mean square error (NRMSE) of the simulated flip angle (FA) distribution and the specific energy dose (SED) (e.g., derived from the specific absorption rate SAR) of measurements from several patients. The optimal COV with the FA-NRMSE (e.g., homogeneity) and the maximum local SED with simulated pTx-pulse-design from datasets of a number N of patients (e.g., coil sensitivities, B0 maps, VOP data) and the weighting coefficients $w_H$ and $w_S$ is calculated by solving the minimization problem $$\min_{COV} \sum_p^N [w_H \exp(NRMSE_p(COV)) + w_s \exp(SED_p(COV))]. \quad (1)$$

For each set of COV, the individual pulse optimization for N patients is simulated. From this, the NRMSE values and SED values are used according to the above formula. These values should be minimized during the optimization process (e.g., global optimization process). The COV for which this function gives the lowest value are selected.

An optimization of the respective pulse shape $b_0$ (e.g., the RF shape of all channels) is calculated similarly by solving the minimization problem $$\min_{b_0} \sum_p^N [w_H \exp(NRMSE_p(b_{0,COV_{opt}})) + w_s \exp(SED_p(b_{0,COV_{opt}}))]. \quad (2)$$

Alternatively or additionally to a grid (e.g., a dictionary), a neural network may be used to accomplish the task of the present embodiments. This neural network may be a "Convolutional Neural Network" (CNN) that is trained with map pairs.

A method according to the present embodiments for creating a dictionary of pulse data for controlling a magnetic resonance imaging system includes the following acts: Providing a set of a plurality of map pairs (e.g., reference map pairs) from different patients, each map pair including a B0 map and a B1 map of a patient; calculating for each map pair a set of pulse data that is configured for applying pulses to measure different sub-regions (e.g., slices or cubes) in a region of interest; and creating a dictionary including the calculated pulse data in relation to the respective sub-regions (e.g., slices or other volumes).

A method according to the present embodiments for creating a trained neural network (e.g., a CNN) for controlling a magnetic resonance imaging system includes the following acts: Providing a set of a plurality of map pairs from different patients, each map pair including a B0 map and a B1 map of a patient; providing an examination scheme for each map pair the respective patient is examined with; providing a ground truth for each map pair including COV and/or pTx pulses; providing an untrained neural network that is configured to assign for each map pair a COV and/or a pTx pulse respective to the examination scheme; and training of the neural network based on the map pairs as input and the respective ground truth.

Thus, the neural network "learns", by using the map pairs, which pTx and/or which COV are optimal for the respective map pairs.

In one embodiment, the training is achieved by solving at least one of the above minimization problems. In the course of calculating the pulse data, for a predefined map pair, COV calculated with the minimal value may be selected from the solution of the above minimization problem, and the equations may not be solved as a general optimization problem like done when searching for good COV.

A trained neural network (e.g., a CNN) according to the present embodiments is trained by a method according to the present embodiments.

A method according to the present embodiments for controlling a magnetic resonance imaging system includes the following acts: providing a pulse-design unit according to the present embodiments; providing an examination scheme including information about the contrasts to be measured and the order and shape of sub-regions of a region of interest to be recorded; generating pulse data with the pulse-design unit based on the examination scheme (e.g., and also by using a map pair), where this may be achieved in that the pulse data for the sub-regions are chosen from the grid (e.g., dictionary) of the pulse-design unit depending from the examination scheme and/or in that the pulse data is calculated by the neural network by measuring map pairs of the respective patient and inputting these map pairs into the neural network; creating a pulse sequence for a measurement with the magnetic resonance imaging system from the generated pulse data.

There are no map pairs necessarily needed during the actual measurement when using the dictionary. However, a calculation with the neural network may use map pairs of the actual patient and may result in a faster method than the use of a dictionary. Thus, the use of a dictionary or a neural network may be made dependent of the actual case.

If map pairs (e.g., B0 maps and B1 maps) of a patient are measured, the map pairs may be analyzed by the neural network. In the course of the analyzation, pulse data (e.g., COV and/or pTx) may be assigned to the patient in total or to slices in the field of view. This allows the optimization of pulse data (e.g., COV) during a measurement. In the case no maps should be acquired, the use of the dictionary is advantageous, as described above.

A pulse sequence may be created by replacing predefined "blocks" of signals by signals based on the selected pulse data.

A control device according to the present embodiments for controlling a magnetic resonance imaging system includes the following components: A pulse-design unit according to the present embodiments; a data interface configured for receiving an examination scheme including information about the contrasts to be measured and the order of sub-regions of a region of interest to be recorded; a sequence unit configured for creating a pulse sequence for a measurement with the magnetic resonance imaging system from pulse data generated by the pulse-design unit. This sequence-unit may be part of the pulse-design unit.

Thus, the control device is configured to perform the method according to the present embodiments. The control device may include additional units or devices for controlling components of a magnetic resonance imaging system (e.g., a sequence control unit for measurement sequence control, a memory, a radio frequency (RF) transmission device that generates, amplifies, and transmits RF pulses, a gradient system interface, a radio frequency reception device to acquire magnetic resonance signals, and/or a reconstruction unit to reconstruct magnetic resonance image data).

A magnetic resonance imaging system including a control device according to the present embodiments is also provided.

Some units or modules of the control device mentioned above (e.g., the pulse-design unit) may be completely or partially realized as software modules running on a processor of a control device. A realization largely in the form of software modules may have the advantage that applications already installed on an existing system may be updated, with relatively little effort, to install and run these units of the present application.

As another example, a computer program product with a computer program that is directly loadable into the memory of a control device of a magnetic resonance imaging system is also provided. The computer program product includes program units to perform the acts of the method of one or more of the present embodiments when the program is executed by the control device. In addition to the computer program, such a computer program product may also include further parts such as documentation and/or additional components, and hardware components such as a hardware key (e.g., dongle, etc.) to facilitate access to the software.

As an example, a computer readable medium (e.g., a non-transitory computer-readable storage medium) such as a memory stick, a hard-disk, or other transportable or permanently-installed carrier may serve to transport and/or to store the executable parts of the computer program product so that these may be read from a processor unit of a control device. A processor unit may include one or more microprocessors or their equivalents.

Features of different categories (e.g., apparatus and method) may be combined as appropriate to give further embodiments not described herein.

One embodiment of a pulse-design unit is configured to generate selective pulse data that includes data about slice-selective pulses for the acquisition of MRI data. The data may include information about selective pulses that are on a spoke trajectory in k-space. The k-space lines used to calculate selective pulse data may lead (e.g., all lead) though the center of k-space. However, depending on the desired examination, the pulse-design unit may also be configured to generate non-selective pulses.

One embodiment of a pulse-design unit includes a dictionary including generated pulse data. The dictionary may be created by a method including the following acts: providing a set of a plurality of map pairs from different patients, each map pair including a B0 map and a B1 map of a patient; calculating for each map pair a set of pulse data that is configured for applying pulses to measure different sub-regions in a region of interest; creating a dictionary including the calculated pulse data in relation with the respective sub-regions.

According to an embodiment of a method, the relation of the pulse data with respective sub-regions in the dictionary is achieved with a labeling of the pulse data. Alternatively or additionally, the relation of the pulse data with respective sub-regions is achieved with an arrangement of the pulse data on a grid representing the sub-regions.

One embodiment of a pulse-design unit includes a neural network (e.g., a convolutional neural network) configured to generate pulse data, while with the term "generating", typically "choosing" and/or "calculating" is provided. In one embodiment, the data interface is configured for receiving a map pair, and the calculation module is configured for generating pulse data based on an examination scheme and a map pair.

In one embodiment, the neural network is trained by a method including the following acts: providing a set of a plurality of map pairs from different patients, each map pair including a B0 map and a B1 map of a patient; providing an examination scheme for each map pair the respective patient is examined with; providing a ground truth for each map pair including COV and/or pTx pulses; providing an untrained neural network that is configured to assign for each map pair COV and/or a pTx pulse respective to the examination scheme; and training of the neural network based on the map pairs as input and the respective ground truth.

According to an embodiment, the pulse data is configured to control data recording of an MRI system with a basic magnetic field greater than 3 T (VHF) (e.g., greater than 7 T (UHF)).

According to an embodiment, the pulse data is configured for an MRI system including a predefined number of RF coils of the RF transmission antenna system for applying RF-signals. The pulse data includes control data for a number of RF coils (e.g., for each RF coil) and may also include control data for gradient coils of the MRI system.

According to an embodiment, the pulse data is configured for parallel transmission (e.g., for parallel transmission of universal pulses and/or pulses calculated with COV). Universal pulses and pulses calculated with COV have in common that both are completely (e.g., universal) or partly (e.g., COV) based on pre-calculated pulses. The method is generally suitable for any kind of precalculated pulses; however, COV-based pulses may be provided.

According to an embodiment, the pulse data includes data about the shape of signals of a pulse sequence (e.g., the shape of RF pulses, "RF shapes", such as voltage curves; of all channels of the transmission coils). In one embodiment, the shape of gradient pulses and/or data about a trajectory in k-space and constraints are part of the pulse data.

According to an embodiment, the pulse data for an individual sub-region is calculated from the pulse data of the map pairs according to this sub-region. In one embodiment, respective data of different patients is averaged, or optimal respective pulse data is chosen from pulse data created of a map pair.

In one embodiment, each slice with every orientation of B1/B0 masks from previously acquired map pairs may be grouped with respect to similarity to each other. On each B1/B0 map cluster, a pulse may be configured. During an actual acquisition, a pulse dependent on the similarity of the acquired B0/B1 maps (e.g., map pairs) and the most similar one from the dictionary may be played out.

In one embodiment, the universal field of view (e.g., a 3D-FOV) or masks are divided in a number of slabs or slices. Slab-specific spoke positions (e.g., spoke trajectories used for exciting the slab) and energy weights are optimized universally (e.g., a dictionary is created) or individually with COV for the slabs (e.g., $COV\_slab_i := [P_{Spokes,i}, \lambda_i]$, where i denotes the number of COV/slab).

Derived from the preceding description, two options to achieve the desired results that may be applied alone or in combination with another may be provided. The first option uses an optimization of COV and the training of a neuronal network to assign COV to given map pairs. During a measurement, an acquisition (e.g., a fast acquisition) of map pairs of a patient (e.g., B0/B1 maps) and a calculation (e.g., a selection) of COV matching the inputted map pairs by the trained neural network and performed. A trajectory for pulse data is defined by the resulting COV data, and pulse shapes are optimized based on the resulting COV and corresponding pulse shapes (e.g., online).

The same may be achieved by using pTx pulses instead of COV (e.g., replace COV with pTx pulses in the preceding paragraph). Also, a combination of COV and pTx pulses is possible (e.g., an additional optimization of pulse forms of selected pulses based on the COV).

The second option uses an optimization of prepared pTx pulses for different B1/B0 maps depending on the position of a slab to be measured (e.g., relative to a coil or the patient). Then, a dictionary that may assign each slab position a universal pulse is created. In the course of a measurement, there is no need for the acquisition of map pairs or pTx optimization. Universal pulses are chosen from the dictionary based on a slab-position to be excited during a measurement.

Regarding the first option, a dictionary may also be used, as long as the dictionary includes a grid of COV (e.g., a dictionary created in the second option as long as the dictionary includes COV). Based on this dictionary, COV are chosen.

Regarding the second option, a neural network (e.g., from the first option) may also be used. This alternative may be advantageous. The neural network chooses prepared pTx pulses (e.g., and no COV that are further optimized) and inserts the prepared pTx pulses in a pulse sequence or applies the prepared pTx pulses directly.

According to one embodiment of a method for an examination of a patient, the pulse data is calculated by a neural network (e.g., of the pulse-design unit) by measuring map pairs of the respective patient and inputting these map pairs into the neural network.

According to one embodiment of a method for an examination of a patient, pulse data for sub-regions are chosen from a dictionary of the pulse-design unit depending on the examination scheme.

According to one embodiment of a method (e.g., control method), for a sub-region (e.g., of the examination scheme) for which no pulse data is present in the dictionary, intermediate pulse data is calculated from pulse data according to sub-regions of the dictionary that are adjacent to the sub-region (e.g., of the examination scheme). The creation of the intermediate pulse data may include averaging of pulse data or choosing the pulse data of the nearest sub-region in the dictionary.

In an embodiment, components are part of a data network, where the data network and the control device of a magnetic resonance imaging system are in data-communication with each other. The data-network may include parts of the Internet and/or a cloud-based computing system, where components performing the method according to the present embodiments are, for example, realized in this cloud-based computing system. Such a networked solution may be implemented via an Internet platform and/or in a cloud-based computing system.

The method may also include elements of "cloud computing". In the technical field of "cloud computing", an IT infrastructure is provided over a data network (e.g., a storage space or processing power and/or application software). The communication between the user and the "cloud" is achieved by data interfaces and/or data transmission protocols.

In the context of "cloud computing", in one embodiment of the method, provision of data via a data channel (e.g., a data network) to a "cloud" takes place. This "cloud" includes a computing system (e.g., a remote computing system such as a computer cluster that typically does not include a local machine of the user). This cloud may be made available, for example, by the medical facility, which also provides the medical imaging systems. For example, the image acquisition data is sent to a computer system (e.g., a remote computer system, the "cloud") via a Radiology Information System (RIS) or a Picture Archiving and Communication System (PACS).

Within the scope of an embodiment of the system, the abovementioned units (e.g., the dictionary unit and/or the sequence unit) are present on the "cloud" side. A system of the present embodiments also includes a local computing unit connected to the system via a data channel (e.g., a data network; a data network configured as RIS or PACS). The local computing unit includes at least one data receiving interface to receive data. Further, the local computer may also have a transmission interface in order to send data to the system.

Advantages of the present embodiments are that the present embodiments provide a fully automated solution while using a grid or alternatively a clustering approach to find pulses that correspond to predefined orientations. The present embodiments also allow a fast selection of the correct pulses, enabling universal pulses, or using the pulses as a starting value.

DETAILED DESCRIPTION

In the diagrams, like numbers refer to like objects throughout. Objects in the diagrams are not necessarily drawn to scale.

Figure 1:
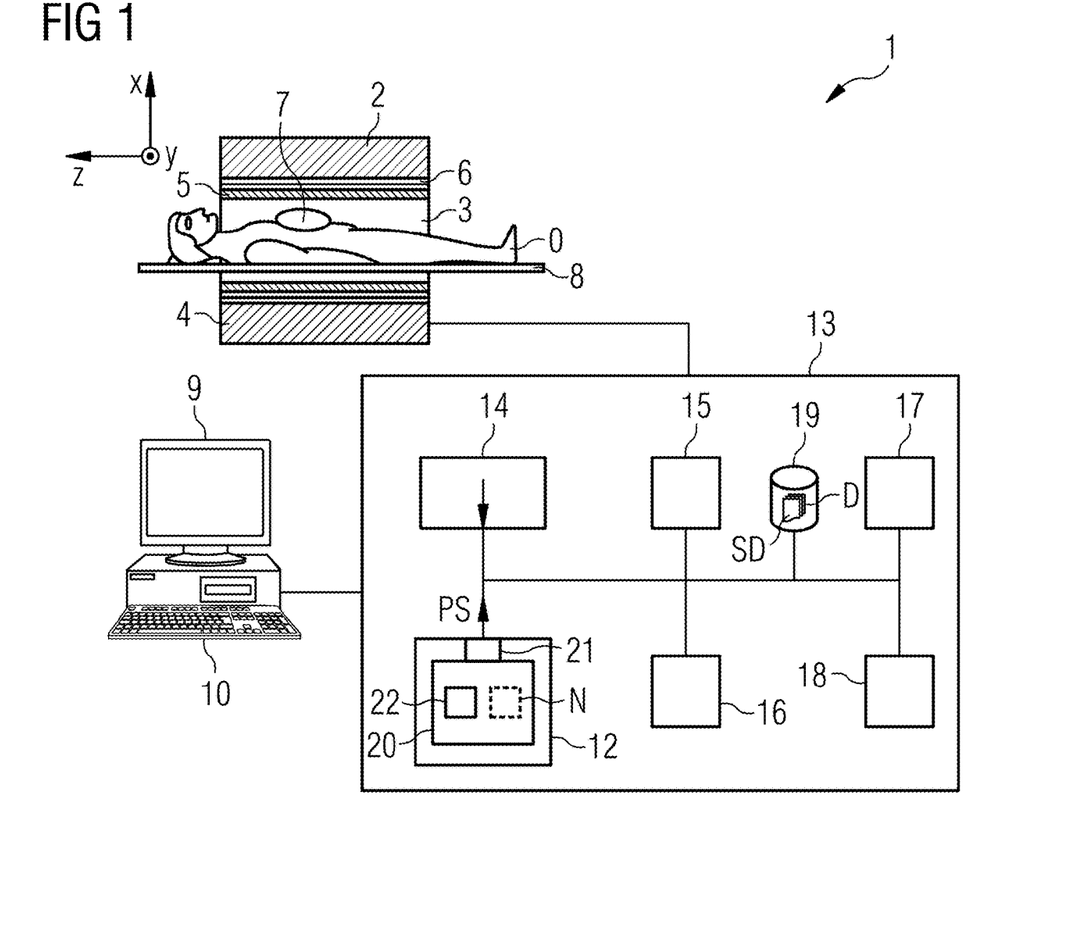
FIG. 1 shows a simplified magnetic resonance imaging (MRI) system according to an embodiment.

FIG. 1 shows a schematic representation of a magnetic resonance imaging (MRI) system 1. The MRI system 1 includes an actual magnetic resonance scanner 2 (e.g., data acquisition unit) with an examination space 3 or patient tunnel in which a patient or test person is positioned on a driven bed 8. The actual examination object is located. in a body of the patient or test person The magnetic resonance scanner 2 is typically equipped with a basic field magnet system 4 (e.g., suited for producing a very high field or an ultra high field), a gradient system 6, a radio frequency (RF) transmission antenna system 5, and an RF reception antenna system 7. In the shown exemplary embodiment, the RF transmission antenna system 5 is a whole-body coil permanently installed in the magnetic resonance scanner 2; in contrast to this, the RF reception antenna system 7 is formed as local coils (e.g., symbolized in FIG. 1 by only a single local coil) to be arranged on the patient or test subject. In principle, however, the whole-body coil may also be used as an RF reception antenna system, and the local coils may respectively be switched into different operating modes.

The basic field magnet system 4 is configured in a typical manner so that the basic field magnet system 4 generates a basic magnetic field in a longitudinal direction of the patient (e.g., along a longitudinal axis of the magnetic resonance scanner 2 that proceeds in the z-direction). The gradient system 6 typically includes individually controllable gradient coils in order to be able to switch (e.g., activate) gradients in the x-direction, y-direction, or z-direction independently of one another.

The MRI system 1 shown in FIG. 1 is a whole-body system with a patient tunnel into which a patient may be completely introduced. However, in principle, the present embodiments may also be used at other MRI systems (e.g., with a laterally open, C-shaped housing, as well as in smaller magnetic resonance scanners in which only one body part may be positioned).

Further, the MRI system 1 has a central control device 13 that is used to control the MRI system 1. This central control device 13 includes a sequence control unit 14 for measurement sequence control. With the sequence control unit 14, the series of radio frequency (RF) pulses and gradient pulses may be controlled depending on a selected pulse sequence (PS) (e.g., including selected pulses created by the method according to the present embodiments) to acquire magnetic resonance images within a measurement session. For example, such a series of pulse sequence PS may be predetermined within a measurement or control protocol (e.g., including results of the method according to the present embodiments). For example, different control protocols for different measurements or measurement sessions are typically stored in a memory 19 and may be selected by an operator and modified by including the correct pulses created by the method according to the present embodiments, and then be used to implement the measurement.

To output the individual RF pulses of a pulse sequence (PS), the central control device 13 has a radio frequency transmission device 15 that generates and amplifies the RF pulses and feeds the RF pulses into the RF transmission antenna system 5 via a suitable interface (not shown in detail). To control the gradient coils of the gradient system 6, the control device 13 has a gradient system interface 16. The sequence control unit 14 communicates in a suitable manner with the radio frequency transmission device 15 and the gradient system interface 16 to emit the pulse sequence PS.

The control device 13 also has a radio frequency reception device 17 (e.g., likewise communicating with the sequence control unit 14 in a suitable manner) in order to acquire magnetic resonance signals (e.g., raw data) for the individual measurements. The magnetic resonance signals are received in a coordinated manner from the RF reception antenna system 7 within the scope of the pulse sequence PS.

A reconstruction unit 18 receives the acquired raw data and reconstructs magnetic resonance image data therefrom for the measurements. This reconstruction is typically performed based on parameters that may be specified in the respective measurement or control protocol. For example, the image data may then be stored in the memory 19.

Operation of the central control device 13 may take place via a terminal 10 with an input unit and a display unit 9, via which the entire MRI system 1 may thus also be operated by an operator. MR images may also be displayed at the display unit 9, and measurements may be planned and started by the input unit (e.g., possibly in combination with the display unit 9). Also, for example, suitable control protocols may be selected and possibly modified with suitable series of pulse sequence (PS), as explained above.

The control device 13 includes a pulse-design unit 12, with a computing module 20, a data interface 21, and a sequence-unit 22 configured to perform the method according to the present embodiments. These components may appear to be software modules. In this example, the sequence unit 22 is part of the computing unit 20 of the pulse-design unit 12 so that the pulse-design unit 12 is suited to generate the pulse data SD and directly create a pulse sequence by using the generated pulse data SD. In this example, the pulse-design unit 12 is configured for receiving a dictionary D with pulse data SD (e.g., selective pulse data SD) that is stored in the memory 19. Alternatively or additionally, the pulse-design unit 12 may include a neural network N, as indicated by the dashed box.

The data interface 21 is configured for receiving an examination scheme E (see, e.g., following figures) including information about the contrasts to be measured and the order of sub-regions of a region of interest to be recorded, The sequence unit 22 is configured for creating a pulse sequence PS for a measurement with the resonance imaging system based on the examination scheme E and the pulse data SD of the dictionary D, where the pulse data SD for the sub-regions are chosen from the dictionary D according to the examination scheme E.

The MRI system 1 according to the present embodiments, and, for example, the control device 13, may have a number of additional components that are not shown in detail but are typically present at such systems (e.g., a network interface in order to connect the entire system with a network and be able to exchange raw data and/or image data or, respectively, parameter maps, but also additional data, such as patient-relevant data or control protocols).

The manner by which suitable raw data is acquired by radiation of RF pulses and the generation of gradient fields, and MR images are reconstructed from the raw data, is known to those skilled in the art and thus need not be explained in detail herein.

Figure 2:
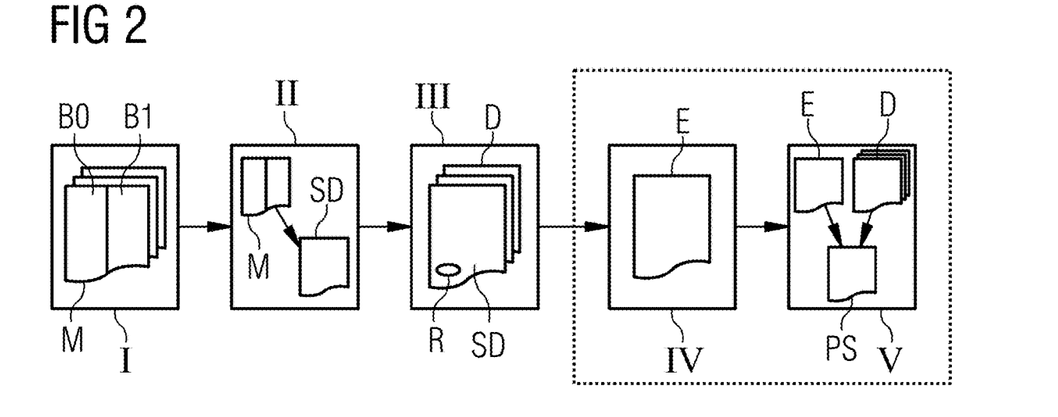
FIG. 2 shows a block diagram of a process flow of one embodiment of a method.

FIG. 2 shows a block diagram of a process flow of one embodiment of a method for controlling a magnetic resonance imaging system 1 (see., e.g., FIG. 1). At first (acts I to III), a dictionary d is created; after that (acts IV and V), this dictionary D is used to create a pulse sequence PS to control the MRI system. Alternatively, a neural network N may be trained and used for the method.

In act I, a set of a plurality of map pairs M from different patients is provided. Each map pair M of the plurality of map pairs M includes a B0 map B0 and a B1 map B1 of a patient.

In act II, a set of pulse data SD (e.g., selective pulse data SD) is calculated for each map pair M. This pulse data SD (e.g., selective pulse data SD) is configured for applying pulses to measure different sub-regions (e.g., slices or cubes) in a region of interest.

In act III, a dictionary D is created. The dictionary D includes the calculated pulse data SD (e.g., selective pulse data SD) in relation with the respective sub-regions R.

In act IV, an examination scheme E including information about the contrasts to be measured and the order of sub-regions R of a region of interest to be recorded is provided.

In act V, a pulse sequence PS for a measurement is created with the resonance imaging system based on the examination scheme E and the pulse data SD (e.g., selective pulse data SD) of the dictionary D, where the pulse data SD (e.g., selective pulse data SD) for the sub-regions R are chosen from the dictionary D according to the examination scheme E.

Figure 3:
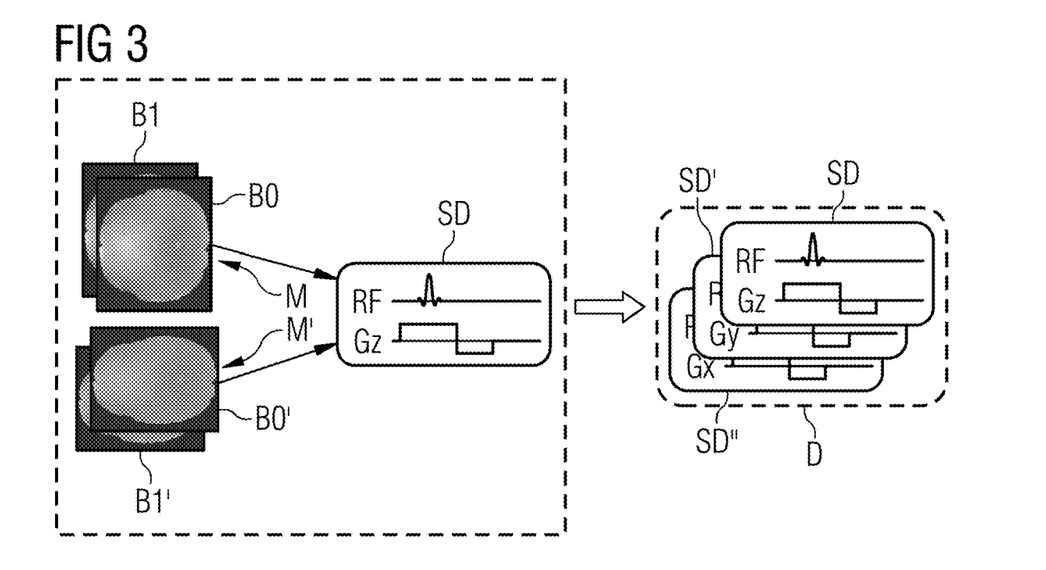
FIG. 3 shows one embodiment of a method for creating a dictionary.

FIG. 3 shows one embodiment of a method for creating a dictionary. FIG. 3 depicts the process of acts I to III of FIG. 2.

Starting on the left side, there are two map pairs M, M', each including a B0 map B0, B0' and a B1 map B1, B1' of a patient. These two map pairs M, M' may represent a plurality of many map pairs of different patients.

Based on these map pairs M, M', a set of pulse data SD (e.g., selective pulse data SD) is calculated. This calculation is based on a predefined sub-region (e.g., a slice). In the shown example (dashed box), the pulse data SD (e.g., selective pulse data SD) includes an RF pule and a Z-gradient representing a pulse (e.g., a selective pulse) applied to measure a slice expanded in the Z-direction. Now, a number of sets of (pulse data SD, SD', SD" (e.g., selective) are calculated for different slices. In this example, two other sets of pulse data (e.g., selective pulse data) is calculated with one set of pulse data SD', SD" (e.g., selective) with a Y-gradient and one with a X-gradient to measure slices oriented in the Y- and X direction. The calculated sets of pulse data SD, SD', SD" (e.g., selective) are combined in a dictionary D shown on the right.

Figure 4:
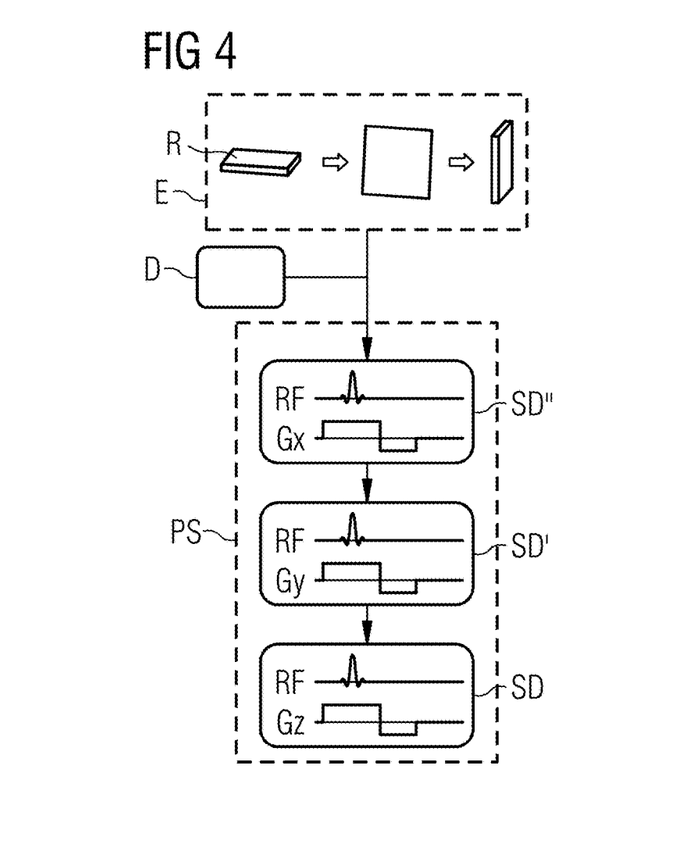
FIG. 4 shows one embodiment of a method for creating pulses by using a dictionary.

FIG. 4 shows one embodiment of a method for creating pulses (e.g., selective pulses) by using a dictionary (e.g., as shown in FIG. 3).

At first, an examination scheme E that includes, for example, the measurement of three slices (e.g., as sub-regions R) oriented in X-, Y- and Z-direction is provided. By using the dictionary, a pulse sequence PS including the sets of pulse data SD, SD', SD" (e.g., selective) that have been calculated in FIG. 3, including gradients on the X-, Y- and Z-axis, is created.

Figure 5:
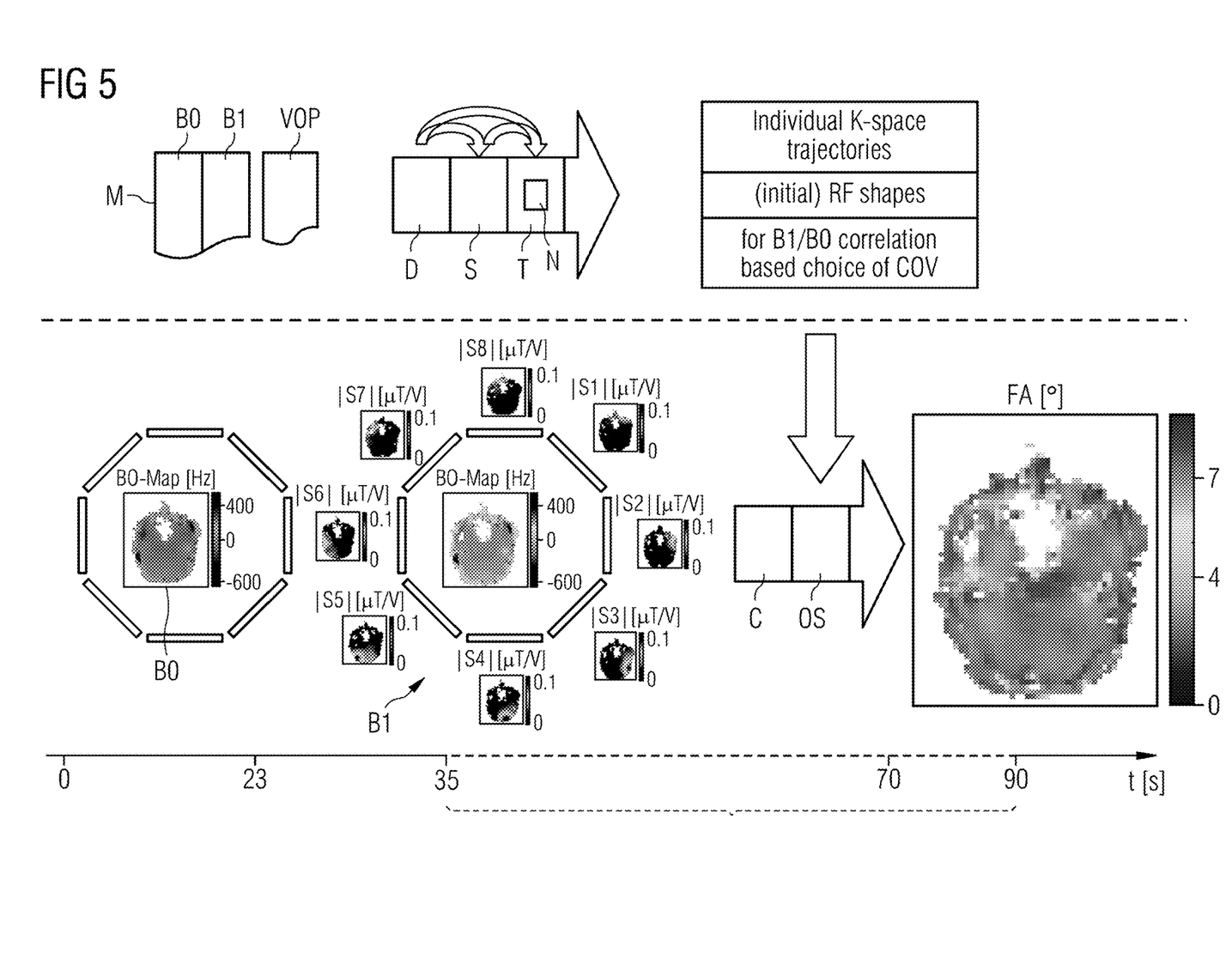
FIG. 5 shows one embodiment of a method for creating pulses by using a neural network.

FIG. 5 shows one embodiment of a method for creating pulses (e.g., selective) by using a neural network N. In addition to map pairs M from different patients, each map pair including a B0 map B0 and a B1 map B1 of the patient, data of Virtual Observation Points VOP is also provided. However, the use of VOP data VOP is optional In the course of an offline optimization (upper big arrow), various COV are calculated and included in a dictionary D (optional). In addition, corresponding RF shapes S are calculated, and these values are the basis for a training T of a neural network N. The results are individual k-space trajectories, RF shapes (e.g., initial RF shapes) and a choice of COV for a B1/B0 correlation.

Then (below the long dashed line), in the course of an online optimization, B0 maps B0 and B1 maps B1 of a patient are measured, and a choice C of COV plus a determination of initial RF shapes is performed (e.g., by using the trained neural network) (horizontal big arrow in the middle). This may be followed by an optional shaping OS procedure, where an individual pulse shaping is provided. This shaping may also be achieved by a/the neural network.

At the bottom, a timescale is shown in form of an arrow, where the time t runs from left to right. A number of points of time are marked in seconds, where the dashed part may be spared by the present embodiments compared to the state of the art (55 seconds). At point 0, the adjustment starts, and 23 seconds later a B0 mapping is ready; 35 seconds later a B1 mapping is complete. In the state of the art, there is now following a B1+ mapping (e.g., 75 seconds from the start) and a pTx pulse calculation (e.g., 90 seconds from the start). This time may be economized by the present method, which provides the desired pulse sequence after 35 seconds. For example, by using dictionary choosing predefined pTx pulses (e.g., Universal Pulses), neither additional sequence preparation time nor a B0 mapping or B1 mapping is needed.

Although the present invention has been disclosed in the form of exemplary embodiments and variations thereon, it will be understood that numerous additional modifications and variations may be made thereto without departing from the scope of the invention. For the sake of clarity, it is to be understood that the use of "a" or "an" throughout this application does not exclude a plurality, and "comprising" does not exclude other steps or elements. The mention of a "unit" or a "device" does not preclude the use of more than one unit or device.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A pulse-design unit for creating pulse data for controlling a magnetic resonance imaging system, the pulse-design unit comprising:
   a data interface configured to receive an examination scheme;
   a calculation module configured to generate pulse data based on the examination scheme; and
   a dictionary comprising the generated pulse data in a data grid,
   wherein the pulse-design unit includes the data grid, or the data grid and parameter values created from map pairs of a plurality of patients, and
   wherein the pulse-design unit is configured to select, calculate, or select and calculate pulse data using the data grid, or the data grid and the parameter values, and the examination scheme.

2. The pulse-design unit of claim 1, wherein the pulse-design unit is further configured to generate selective pulse data that comprises data about slice-selective pulses for acquisition of magnetic resonance imaging (MRI) data.

3. The pulse-design unit of claim 2, wherein the pulse-design unit is further configured to generate selective pulse data that comprises data about selective pulses on a spoke trajectory in k-space.

4. The pulse-design unit of claim 1,
   wherein creation of the dictionary comprises:
      provision of a set of a plurality of map pairs from different patients, each map pair of the plurality of map pairs comprising a B0 map and a B1 map of a patient;
      calculation, for each map pair of the plurality of map pairs, a set of pulse data that is configured for application of pulses to measure the different sub-regions in the region of interest; and
      creation of the dictionary comprising the calculated pulse data in relation to the respective sub-regions.

5. The pulse-design unit of claim 1, further comprising a neural network configured to choose or generate pulse data,
   wherein the neural network is trained by:
      provision of a set of a plurality of map pairs from different patients, each map pair of the plurality of map pairs comprising a B0 map and a B1 map of a patient;
      provision of an examination scheme for each map pair of the plurality of map pairs the respective patient is examined with;
      provision of a ground truth for each map pair of the plurality of map pairs comprising COV, pTx, or COV and pTx pulses;
      provision of an untrained neural network that is configured to assign for each map pair of the plurality of map pairs COV, a pTx, or COV and the pTx pulse respective to the examination scheme; and
      training of the neural network based on the plurality of map pairs as input and the respective ground truth.

6. The pulse-design unit of claim 5, wherein the data interface is configured to receive a map pair, and the calculation module is configured to generate pulse data based on an examination scheme and the map pair.

7. The pulse-design unit of claim 5, wherein the neural network is a convolutional neural network.

8. The pulse-design unit of claim 1, wherein the pulse-design unit is configured to generate pulse data that is configured to control data recording of a magnetic resonance imaging system with a basic magnetic field greater than 3 T.

9. The pulse-design unit of claim 8, wherein the pulse-design unit is configured to generate pulse data that is configured to control data recording of a magnetic resonance imaging system with a basic magnetic field greater than 7 T.

10. The pulse-design unit of claim 1, wherein the pulse-design unit is further configured to:
    generate pulse data that is configured for a magnetic resonance imaging system comprising a predefined number of radio frequency (RF) coils for applying RF signals and the pulse data comprising control data for each RF coil of the predefined number of RF coils of an RF transmission antenna system;
    generate pulse data that is configured for parallel transmission for parallel transmission of universal pulses, pulses calculated with COV, or the universal pulses and the pulses calculated with COV;
    generate pulse data comprising data about a shape of signals of a pulse sequence, data about a trajectory in k-space and constraints, or a combination thereof; or
    any combination thereof.

11. The pulse-design unit of claim 10, wherein the pulse-design unit is further configured to control data for gradient coils of the magnetic resonance imaging system.

12. The pulse-design unit of claim 10, wherein the pulse-design unit is further configured to generate pulse data comprising data about a shape of RF pulses or gradient pulses.

13. The pulse-design unit of claim 1, wherein the pulse-design unit is further configured to generate pulse data for an individual sub-region that is calculated from the pulse data of the map pairs according to the individual sub-region.

14. The pulse-design unit of claim 13, wherein respective data of different patients is averaged, or optimal respective pulse data is chosen from pulse data created of a map pair of the map pairs.

15. A method for controlling a magnetic resonance imaging system, the method comprising:
   providing a pulse-design unit for creating pulse data for controlling the magnetic resonance imaging system, the pulse-design unit comprising a data interface configured to receive an examination scheme, and a calculation module configured to generate pulse data based on the examination scheme, wherein the pulse-design unit includes a data grid, parameter values, or the data grid and the parameter values created from map pairs of a plurality of patients, and wherein the pulse-design unit is configured to select, calculate, or select and calculate pulse data using the data grid, the parameter values, or the data grid and the parameter values and the examination scheme;
   providing the examination scheme, the examination scheme including information about contrasts to be measured and an order of sub-regions of a region of interest to be recorded;
   generating the pulse data with the pulse-design unit based on the examination scheme; and
   creating a pulse sequence for a measurement with the magnetic resonance imaging system from the generated pulse data,
   wherein generating the pulse data comprises calculating, by a neural network, the pulse data, the calculating of the pulse data comprising measuring map pairs of the respective patient and inputting the map pairs into the neural network.

16. The method of claim 15, wherein the pulse-design unit further comprises the neural network, the neural network being trained to assign COV to given map pairs, and
wherein during a measurement, map pairs of a patient are acquired and COV matching the inputted map pairs is calculated by the trained neural network, a trajectory for the pulse data being defined by the COV data, pulse shapes being optimized based on the resulting COV and corresponding pulse shapes, or a combination thereof.

17. The method of claim 15, wherein pulse data for the sub-regions are chosen from a dictionary of the pulse-design unit depending on the examination scheme.

18. The method of claim 17, wherein for a sub-region for which no pulse data is present in the dictionary, the method further comprises calculating intermediate pulse data from pulse data according to sub-regions of the dictionary that are adjacent to the sub-region for which no pulse data is present.

19. The method of claim 18, wherein calculating the intermediate pulse data comprises averaging pulse data or choosing pulse data of a nearest sub-region in the dictionary relative to the sub-region for which no pulse data is present in the dictionary.

20. The method of claim 17, wherein the pulse-design unit comprises a dictionary, the dictionary comprising pulse data in a form of prepared pTx pulses for different map pairs depending on a position of a slab to be measured,
wherein the dictionary assigns each slab position a universal pulse, and
wherein pulse data is chosen from the dictionary based on a slab position to be excited during a measurement defined by the examination scheme.

21. A control device for controlling a magnetic resonance imaging system, the control device comprising:
a data interface configured to receive an examination scheme, the examination scheme comprising information about contrasts to be measured and an order and shape of sub-regions of a region of interest to be recorded;
a pulse-design unit for creating pulse data for controlling the magnetic resonance imaging system, the pulse-design unit comprising a calculation module configured to generate pulse data based on the examination scheme, wherein the pulse-design unit includes a data grid, or the data grid and parameter values created from map pairs of a plurality of patients, and wherein the pulse-design unit is configured to select, calculate, or select and calculate pulse data using the data grid, or the data grid and the parameter values, and the examination scheme;
a sequence unit configured to create a pulse sequence for a measurement with the magnetic resonance imaging system from pulse data generated by the pulse-design unit; and
a dictionary comprising the generated pulse data in the data grid,
wherein creation of the dictionary comprises:
provision of a set of a plurality of map pairs from different patients, each map pair of the plurality of map pairs comprising a B0 map and a B1 map of a patient;
calculation, for each map pair of the plurality of map pairs, a set of pulse data that is configured for application of pulses to measure the different sub-regions in the region of interest; and
creation of the dictionary comprising the calculated pulse data in relation to the respective sub-regions.

22. A pulse-design unit for creating pulse data for controlling a magnetic resonance imaging system, the pulse-design unit comprising:
a data interface configured to receive an examination scheme;
a calculation module configured to generate pulse data based on the examination scheme; and
a neural network configured to choose or generate pulse data,
wherein the pulse-design unit includes a data grid, or the data grid and parameter values created from map pairs of a plurality of patients,
wherein the pulse-design unit is configured to select, calculate, or select and calculate pulse data using the data grid, the parameter values, or the data grid and the parameter values and the examination scheme, and
wherein the neural network is trained by:
provision of a set of a plurality of map pairs from different patients, each map pair of the plurality of map pairs comprising a B0 map and a B1 map of a patient;
provision of an examination scheme for each map pair of the plurality of map pairs the respective patient is examined with;
provision of a ground truth for each map pair of the plurality of map pairs comprising COV, pTx, or COV and pTx pulses;
provision of an untrained neural network that is configured to assign for each map pair of the plurality of map pairs COV, a pTx, or COV and the pTx pulse respective to the examination scheme; and
training of the neural network based on the plurality of map pairs as input and the respective ground truth.

23. A method for controlling a magnetic resonance imaging system, the method comprising:
providing a pulse-design unit for creating pulse data for controlling the magnetic resonance imaging system, the pulse-design unit comprising a data interface configured to receive an examination scheme, and a calculation module configured to generate pulse data based on the examination scheme, wherein the pulse-design unit includes a data grid, parameter values, or the data grid and the parameter values created from map pairs of a plurality of patients, and wherein the pulse-design unit is configured to select, calculate, or select and calculate pulse data using the data grid, the parameter values, or the data grid and the parameter values and the examination scheme;
providing the examination scheme, the examination scheme including information about contrasts to be measured and an order of sub-regions of a region of interest to be recorded;
generating the pulse data with the pulse-design unit based on the examination scheme; and
creating a pulse sequence for a measurement with the magnetic resonance imaging system from the generated pulse data,
wherein pulse data for the sub-regions are chosen from a dictionary of the pulse-design unit depending on the examination scheme.

* * * * *